United States Patent [19]
Gierut

[11] Patent Number: 5,648,891
[45] Date of Patent: Jul. 15, 1997

[54] CIRCUIT BOARD ASSEMBLY

[75] Inventor: Lawrence Gierut, Lockport, Ill.

[73] Assignee: Rockwell International Corp., Seal Beach, Calif.

[21] Appl. No.: 518,371

[22] Filed: Aug. 23, 1995

[51] Int. Cl.⁶ .............. H01R 23/70; H01R 13/62
[52] U.S. Cl. .............. 361/788; 361/740; 361/785; 361/801; 361/803; 439/62; 439/65; 439/325
[58] Field of Search .................. 361/684–686, 361/729, 732–733, 736, 740–741, 747, 756, 759, 784–785, 788, 801–803; 439/61–62, 64–65, 74, 325, 374, 377, 631

[56] References Cited

U.S. PATENT DOCUMENTS

| | | | |
|---|---|---|---|
| 4,400,049 | 8/1983 | Schuck | 439/631 |
| 4,938,701 | 7/1990 | Heberling | 439/65 |
| 5,101,150 | 3/1992 | Sullivan et al. | 371/22.1 |
| 5,181,855 | 1/1993 | Mosquera et al. | 439/74 |

FOREIGN PATENT DOCUMENTS

343864-A  11/1989  European Pat. Off. ........... 439/65

Primary Examiner—Leo P. Picard
Assistant Examiner—John B. Vigushin
Attorney, Agent, or Firm—Welsh & Katz, Ltd.

[57] ABSTRACT

A circuit board assembly (10) having a plurality of circuit board subassemblies (12) having a device (14) for releasably electrically and mechanically connecting the subassemblies (12) into a general configuration of a plane, the subassemblies (12) having a device (16) for electrically and mechanically interconnecting the subassemblies (12) into a system back plane (18). One or more brackets (20) interlock a plurality of the generally planar subassemblies (12) for stability.

3 Claims, 1 Drawing Sheet

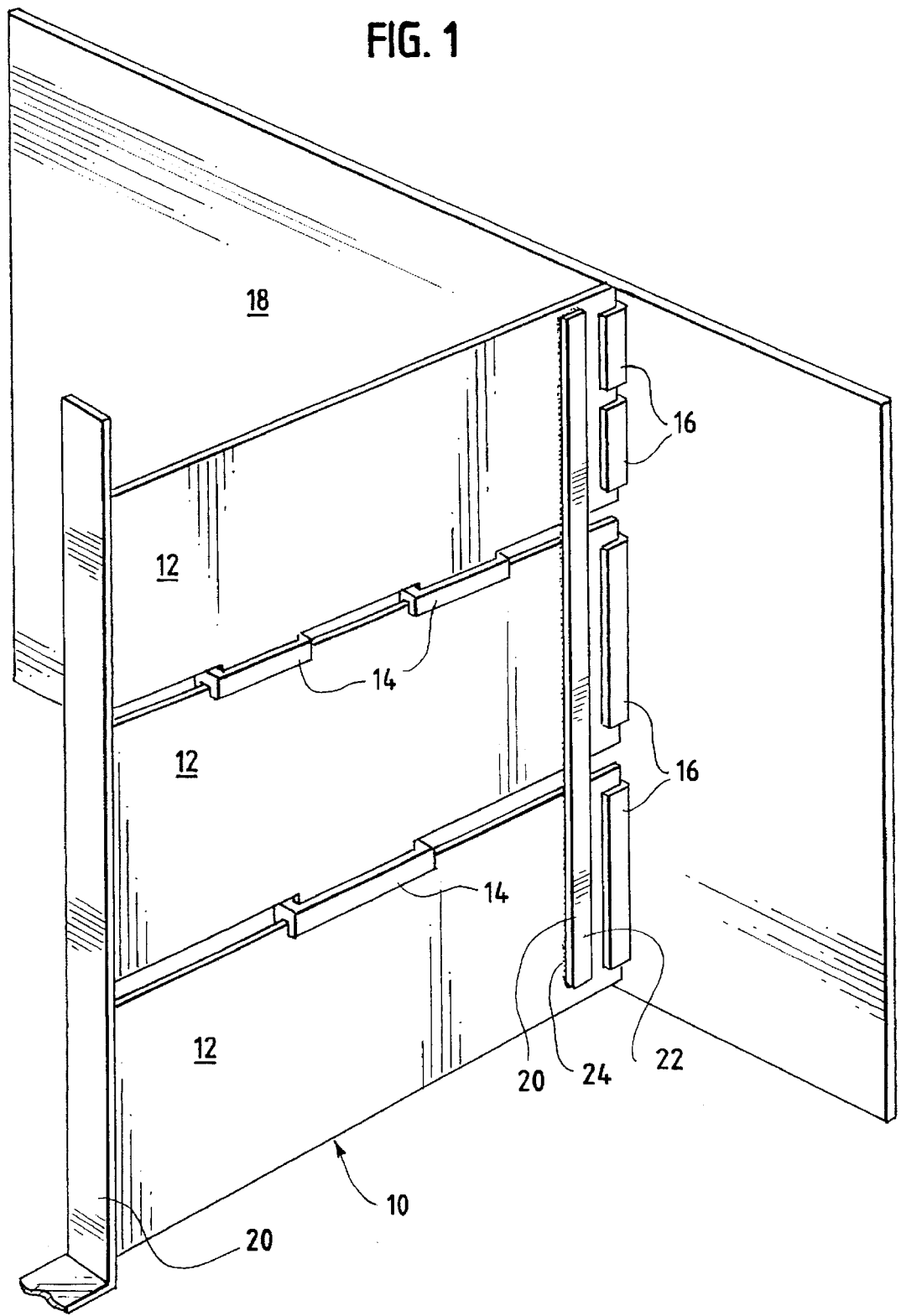

CIRCUIT BOARD ASSEMBLY

BACKGROUND OF THE INVENTION

The present invention relates to circuit board assemblies.

Before the present invention, circuit board assemblies have been known. However, in some cases a relatively large circuit board may be required for some assemblies, such as 30 inches by 12 inches. Although this may be the ideal size of the boards for certain uses, the large boards encounter many difficulties.

First, the larger and more complex a circuit board assembly may be, it is more difficult to test the board for errors. Large boards are more difficult to assemble and test on available production fixtures and the tooling available. Also, the large boards have a tendency to warp, and therefore become a quality problem. The large boards tend to flex and thus can't be used with certain components without introducing potential quality problems due to cracked components and loose solder joints.

In addition, subsets of the board design may need to be upgradable or technology changed, but replacing the large boards for this purpose can be very costly. Design modifications may need to be made on a subset of the main assembly which may cause scrapping of the whole assembly. Such methods of using the boards may also thicken the board thereby occupying more than one slot in a system back plane.

SUMMARY OF THE PRESENT INVENTION

A principal feature of the present invention is the provision of an improved circuit board assembly.

The assembly of the present invention comprises, a plurality of circuit board subassemblies having means for releasably electrically and mechanically connecting the subassemblies into a general configuration of a plane, and said subassemblies having means for electrically and mechanically interconnecting the subassemblies into a system back plane.

A feature of the invention is that the subassemblies are mechanically and electrically connected together, while reducing the size substantially of each subassembly as compared to the whole assembly.

Another feature of the invention is that the connected subassemblies are mechanically and electrically connected to a system back plane.

A feature of the invention is that the smaller subassemblies alleviate the problem of warping.

Another feature of the invention is that since the subassemblies are smaller and contain less components, the subassemblies are easier to trouble shoot than the whole assembly at once.

Still another feature of the invention is that each subassembly may be replaced during an upgrade or design modification without affecting the whole assembly.

Yet another feature of the invention is that the connecting means comprises electrically conductive pin connectors.

Another feature of the invention is that different logical components may be introduced into each subassembly, such as one module containing a main system interface, another module may be a processor core, and a third module may be a combination of a memory module and hard disk controller.

Further features will become more fully apparent from the following detailed description of the embodiments of this invention, and from the appended claims.

DESCRIPTION OF THE DRAWINGS

In the drawings:

FIG. 1 is a diagrammatic perspective view of a circuit board assembly of the present invention.

DESCRIPTION OF THE PREFERRED EMBODIMENTS

Referring now to FIG. 1, there is shown an electric circuit board assembly generally designated 10. The assembly 10 has a plurality of electric circuit board subassemblies or modules 12. The subassemblies have a plurality of electrically conductive pin connectors 14 which electrically and mechanically releasably connect the subassemblies 12 together in the general configuration of a plane.

The subassemblies 12 also have a plurality of electrically conductive pin connectors 16 which electrically and mechanically releasably connect the assembled subassemblies 12 into a system back plane 18. The assembly 10 has one or more brackets 20 which releasably retain the subassemblies 12 in the assembled relationship, and provide strength and stability to the assembly 10 when assembled by the subassemblies 12. For example, the brackets 20 may have a backing 22 having a suitable adhesive 24 to releasably interlock the brackets 20 to the assembly 10.

Thus, in accordance with the present invention, a large circuit board assembly 10 is provided with a plurality of assembled subassemblies 12. In this configuration, the assembly has no hidden components, and is easier to trouble shoot for errors as compared to one large circuit board. Moreover, in the event of changes to the electrical components, only one of the subassemblies 12 may need be replaced, while keeping the remaining subassemblies 12 intact.

The foregoing detailed description has been given for clearness of understanding only, and no unnecessary limitations should be understood therefrom, as modification will be obvious to those skilled in the art.

What is claimed is:

1. A circuit board assembly, comprising:

a plurality of circuit board subassemblies having means for releasably electrically and mechanically connecting the subassemblies into a general configuration of a plane, and said subassemblies having means for electrically and mechanically interconnecting the subassemblies into a system back plane, including at least one interlocking bracket for the subassemblies for stability of the interconnected subassemblies, said bracket interconnecting a plurality of generally planar subassemblies.

2. The assembly of claim 1 wherein the subassembly connecting means comprises a plurality of pin connectors.

3. The assembly of claim 1 wherein the interconnecting means comprises a plurality of pin connectors with each subassembly having at least one pin connector for connecting the interconnecting subassemblies into the back plane.

* * * * *